United States Patent
Baba et al.

(10) Patent No.: US 11,145,587 B2
(45) Date of Patent: Oct. 12, 2021

(54) ELECTRONIC COMPONENT MOUNTING SUBSTRATE, ELECTRONIC DEVICE, AND ELECTRONIC MODULE

(71) Applicant: KYOCERA Corporation, Kyoto (JP)

(72) Inventors: Yuuki Baba, Kyoto (JP); Yousuke Moriyama, Kyoto (JP)

(73) Assignee: KYOCERA CORPORATION, Kyoto (JP)

(*) Notice: Subject to any disclaimer, the term of this patent is extended or adjusted under 35 U.S.C. 154(b) by 0 days.

(21) Appl. No.: 16/614,927

(22) PCT Filed: May 25, 2018

(86) PCT No.: PCT/JP2018/020170
§ 371 (c)(1),
(2) Date: Nov. 19, 2019

(87) PCT Pub. No.: WO2018/216801
PCT Pub. Date: Nov. 29, 2018

(65) Prior Publication Data
US 2020/0105658 A1    Apr. 2, 2020

(30) Foreign Application Priority Data

May 26, 2017  (JP) .............................. JP2017-104725

(51) Int. Cl.
*H01L 33/62* (2010.01)
*H01L 23/498* (2006.01)
(Continued)

(52) U.S. Cl.
CPC .. *H01L 23/49838* (2013.01); *H01L 23/49822* (2013.01); *H01L 33/62* (2013.01); *H01L 33/647* (2013.01); *H01L 33/60* (2013.01)

(58) Field of Classification Search
CPC ......... H01L 23/49838; H01L 23/49822; H01L 33/62; H01L 33/647; H01L 33/60;
(Continued)

(56) References Cited

U.S. PATENT DOCUMENTS 9,704,791 B2 * 7/2017 Murakami ........ H01L 23/49811
2013/0049564 A1    2/2013 Jung et al.
(Continued)

FOREIGN PATENT DOCUMENTS

JP    2008-130946 A    6/2008
JP    2015-159245 A    9/2015

*Primary Examiner* — Moin M Rahman
(74) *Attorney, Agent, or Firm* — Volpe Koenig

(57) ABSTRACT

An electronic component mounting substrate includes: an insulating substrate having a recess that opens in a main surface of the insulating substrate, the recess for mounting an electronic component; a metal layer located on a bottom surface of the recess; an external electrode located on the other main surface of the insulating substrate, the other main surface opposite to the main surface; a connection wiring located between the metal layer and the external electrode in a thickness direction of the insulating substrate; a plurality of first vias that connects the metal layer and the connection wiring and that is located along a side wall of the recess in a perspective plan view; and a plurality of second vias that connects the connection wiring and the external electrode and that is located in a strip shape in the perspective plan view.

7 Claims, 13 Drawing Sheets

(51) Int. Cl.
*H01L 33/64* (2010.01)
*H01L 33/60* (2010.01)

(58) Field of Classification Search
CPC . H01L 2224/16225; H01L 2224/48227; H01L 23/12; H01L 23/36; H01L 33/64; H01L 2933/00–0091; H01L 27/15–156; H01L 33/00–648; H01L 51/524–525; H01L 25/048; H01L 27/14–14893; H01L 31/145–153; H01L 31/165–173; H01L 25/075–0756; H01L 25/13; H01L 25/16–167; H01L 25/18; H01L 33/52–56; H01L 51/5253–5256; H01L 51/448; H01L 25/167; H01L 27/153; H01L 27/32; H01L 27/3202; H01L 27/3204; H01L 27/3209; H01L 27/3225; H01L 27/3251; H01L 27/3258; H01L 51/50; H01L 51/525; H01L 51/5287; H01L 2227/32; H01L 2227/326; H01L 2251/5323; H01L 2251/5338; H01L 2251/5353; H01L 2251/56; H01L 2251/566; H01L 29/12041; H01L 29/12044; H01L 33/20; H01L 51/5209; H01L 27/322; H01L 51/00; H01L 33/58; H01L 27/1248; H01L 33/505; H01L 29/78633; H01L 27/3244; H01L 51/5262; H01L 33/486; H01L 25/0753; H01L 2224/45144; H01L 33/54; H01L 2224/48091; H01L 2224/48137; H01L 33/641; H05K 3/46

See application file for complete search history.

(56) References Cited

U.S. PATENT DOCUMENTS

2015/0146397 A1\* 5/2015 Fujihara .................. H05K 1/111
    361/767
2015/0305160 A1\* 10/2015 Funahashi .............. H05K 1/183
    348/374

\* cited by examiner

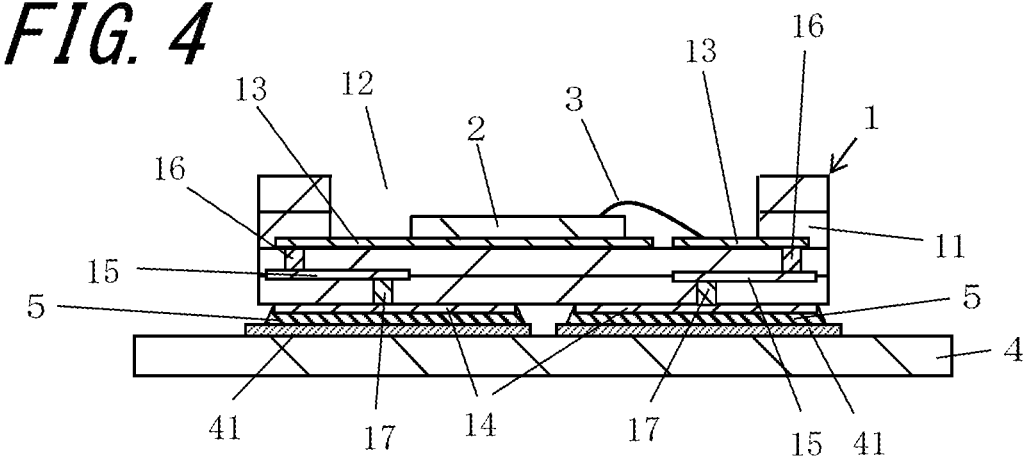
FIG. 4
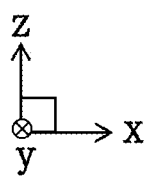

ELECTRONIC COMPONENT MOUNTING SUBSTRATE, ELECTRONIC DEVICE, AND ELECTRONIC MODULE

TECHNICAL FIELD

The present invention relates to an electronic component mounting substrate, an electronic device, and an electronic module.

BACKGROUND ART

In related art, an electronic device and an electronic component mounting substrate for mounting an electronic component on a main surface of an insulating substrate made of ceramics are known (for example, see Japanese Unexamined Patent Application Publication No. 2015-159245).

In such an electronic component mounting substrate, the insulating substrate includes a recess in which an electronic component is stored and mounted on an upper surface, and includes a metal layer extending from a bottom surface of the recess to a side wall thereof, an external electrode for connecting to a module substrate on a lower surface thereof, and a via for connecting the metal layer and the external electrode.

SUMMARY OF INVENTION

The electronic component mounting substrate according to the present disclosure includes an insulating substrate having a recess that opens in a main surface of the insulating substrate, the recess for mounting an electronic component, a metal layer located on a bottom surface of the recess, an external electrode located on the other main surface of the insulating substrate, the other main surface opposite to the main surface, a connection wiring located between the metal layer and the external electrode in a thickness direction of the insulating substrate, a plurality of first vias that connects the metal layer and the connection wiring and that is located along a side wall of the recess in a perspective plan view, and a plurality of second vias that connects the connection wiring and the external electrode and that is located in a strip shape in the perspective plan view.

An electronic device according to the present disclosure includes the electronic component mounting substrate having the configuration described above and the electronic component mounted in the recess.

An electronic module according to the present disclosure includes a module substrate having a connection pad, and the electronic device described above connected to the connection pad through solder.

BRIEF DESCRIPTION OF DRAWINGS

FIG. 4 is a longitudinal sectional view showing an electronic module mounted on a module substrate using the electronic device in FIGS. 1A and 1B.

DESCRIPTION OF EMBODIMENTS

Figure 1A:
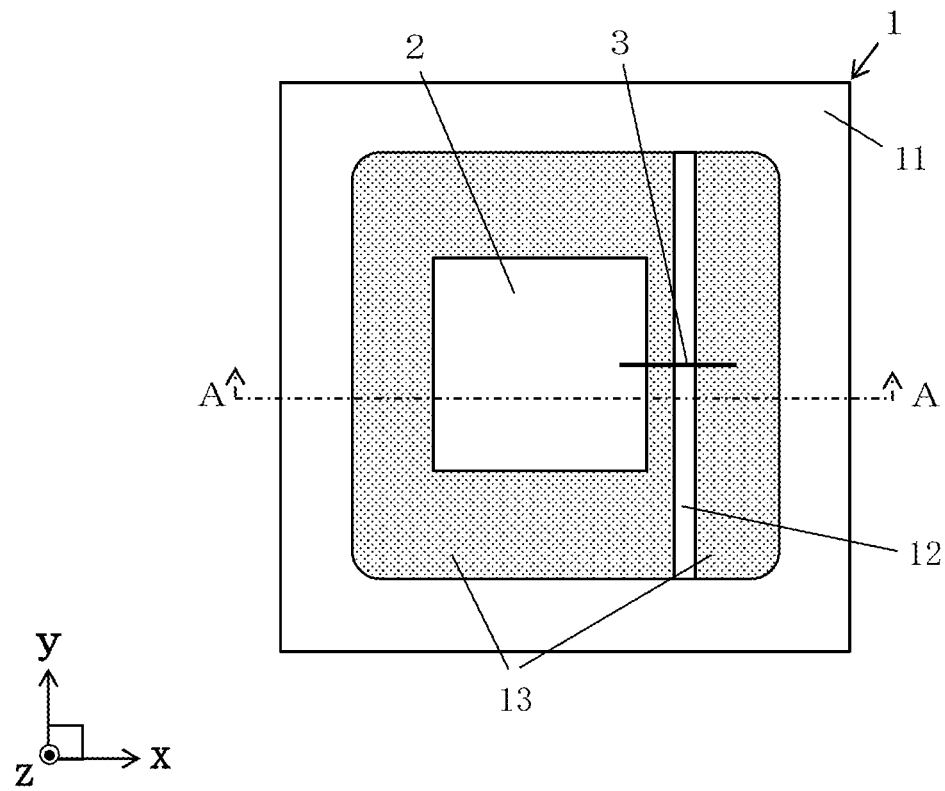
FIG. 1A is a top view showing an electronic device according to a first embodiment.

Several exemplary embodiments of the present disclosure will be described with reference to the accompanying drawings.

First Embodiment

As shown in FIGS. 1A to 4, the electronic device according to the first embodiment includes an electronic component mounting substrate 1 and an electronic component 2 mounted in a recess 12 of the electronic component mounting substrate 1. As shown in FIG. 4, the electronic device is connected to a module substrate 4 forming an electronic module using solder 5, for example.

According to the present embodiment, the electronic component mounting substrate 1 includes an insulating substrate having a recess 12 that opens in a main surface of the insulating substrate 11, the recess for mounting an electronic component 2, a metal layer 13 located on a bottom surface of the recess 12, an external electrode 14 located on the other main surface of the insulating substrate 11, the other main surface opposite to the main surface, a connection wiring 15 located between the metal layer 13 and the external electrode 14 in a thickness direction of the insulating substrate 11. The electronic component mounting substrate 1 includes a plurality of first vias 16 connecting the metal layer 13 and the connection wiring 15 and located along a side wall of the recess in a perspective plan view, a plurality of second vias 17 connecting the connection wiring 15 and the external electrode 14 and located in a strip shape in the perspective plan view. In FIGS. 1A to 4, the upward direction means the positive direction of the virtual z axis. Note that the distinction between the upward and downward directions in the following description is for convenience, and does not limit the upward and downward directions if the electronic component mounting substrate 1 or the like is actually used.

Figure 1B:
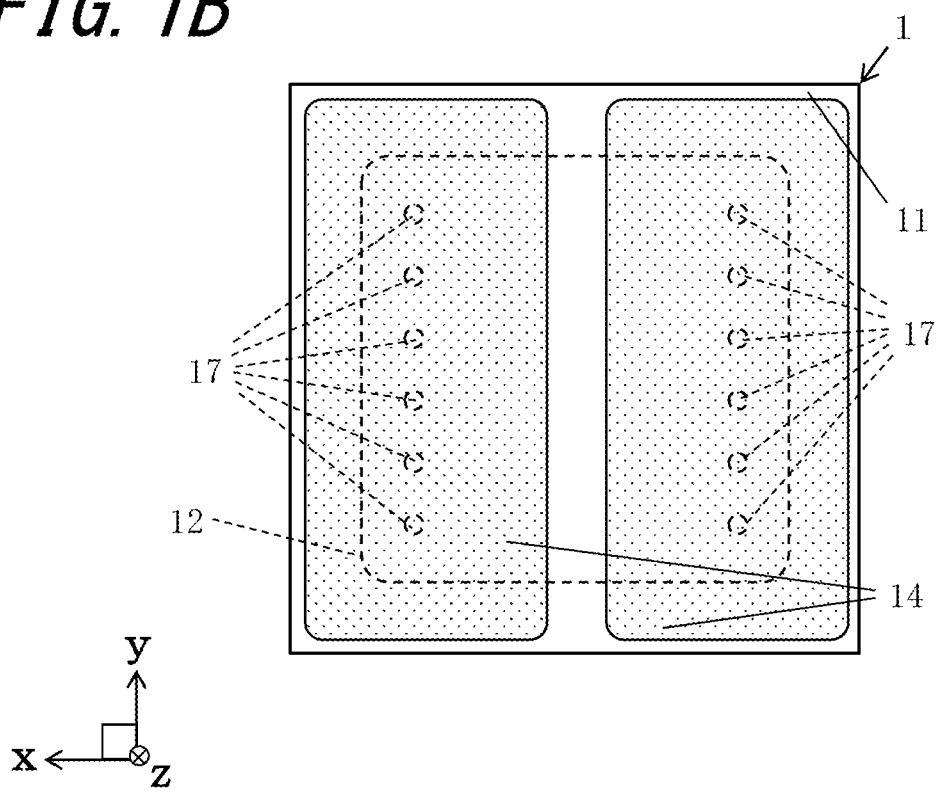
FIG. 1B is a bottom view of FIG. 1A.

In the example shown in FIG. 1B, in a perspective plan view, a portion that overlaps the side wall of the recess 12 and portions that overlap the side surfaces of the second vias 17 are indicated by dotted lines. In the example shown in FIG. 2A, in a perspective plan view, a portion that overlaps the side wall of the recess 12 and regions that overlap the side surfaces of the first vias 16 are indicated by dotted lines. In the example shown in FIG. 2B, a portion that overlaps the side wall of the recess 12, and portions that overlap the side surfaces of the first vias 16 and the side surfaces of the second vias 17 are indicated by dotted lines.

The insulating substrate 11 includes a main surface (upper surface in FIGS. 1A to 4), the other main surface (lower surface in FIGS. 1A to 4) opposite to the main surface, and side surfaces. The insulating substrate 11 includes a plurality of insulating layers 11a, and includes a recess 12 that opens in a main surface of the insulating substrate 11, the recess for mounting the electronic component 2. The insulating substrate 11 has a rectangular plate shape if viewed from a plan view, that is, from a direction perpendicular to the main surface. The insulating substrate 11 serves as a support for supporting the electronic component 2, and on a mounting portion on the bottom surface of the recess 12, the electronic component 2 is bonded and fixed through a connection member 3 such as a solder bump, a gold bump, a conductive resin (for example, anisotropic conductive resin), or a resin.

For the insulating substrate 11, for example, ceramics such as an aluminum oxide sintered body (alumina ceramic), an aluminum nitride sintered body, a silicon nitride sintered body, a mullite sintered body, or a glass ceramic sintered body can be used. For example, if the insulating substrate 11 is an aluminum oxide sintered body, an appropriate organic binder, solvent, and the like are added to and mixed with raw material powders such as aluminum oxide ($Al_2O_3$), silicon oxide ($SiO_2$), magnesium oxide (MgO), and calcium oxide (CaO) to prepare a slurry. A ceramic green sheet is prepared by shaping this slurry into a form of a sheet using a conventionally-known doctor blade method or calender roll method, and the like. Next, an appropriate punching is performed on the ceramic green sheet, a plurality of ceramic green sheets is laminated to form a green body, and the green body is fired at a high temperature (about 1600° C.) to prepare the insulating substrate 11.

Figure 2A:
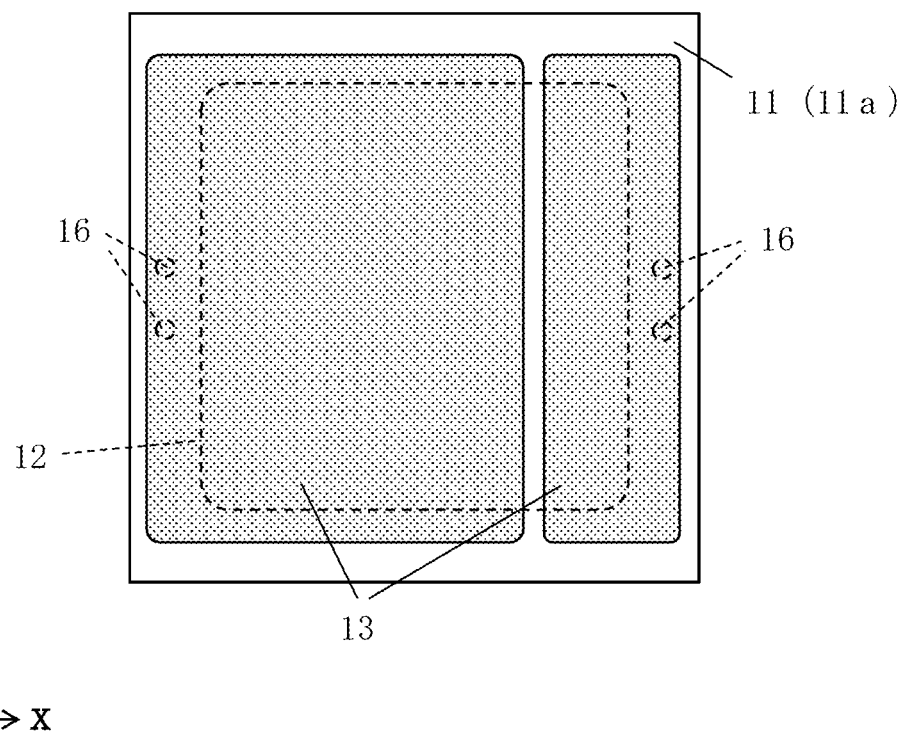
FIGS. 2A and 2B are internal top views showing an electronic component mounting substrate in the electronic device shown in FIGS. 1A and 1B.
Figure 2B:
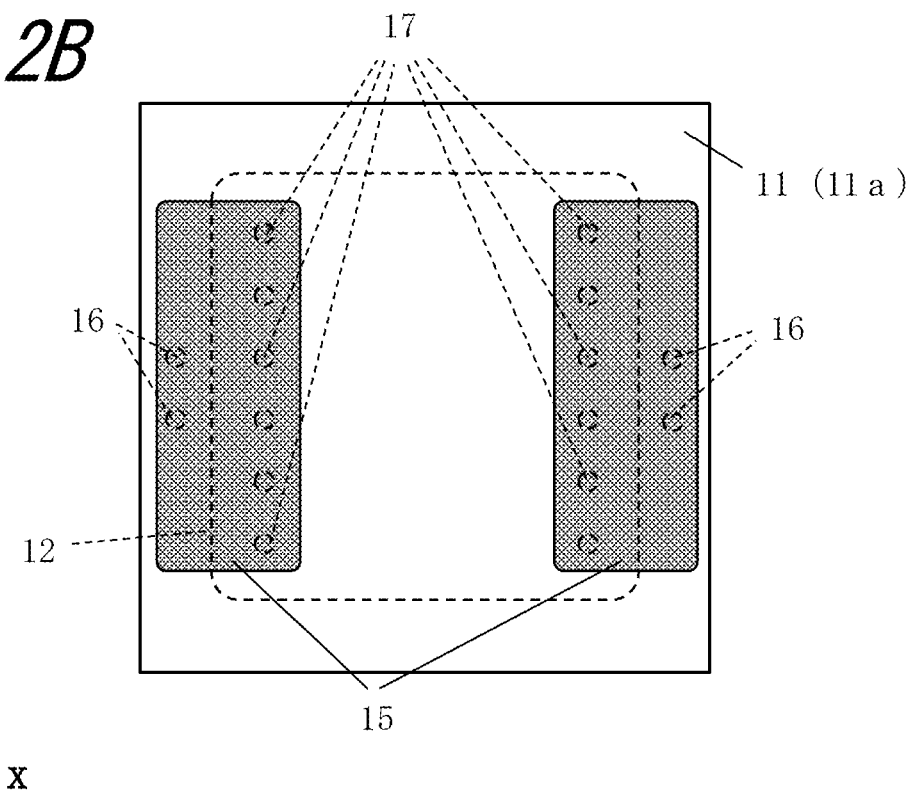
Figure 3:
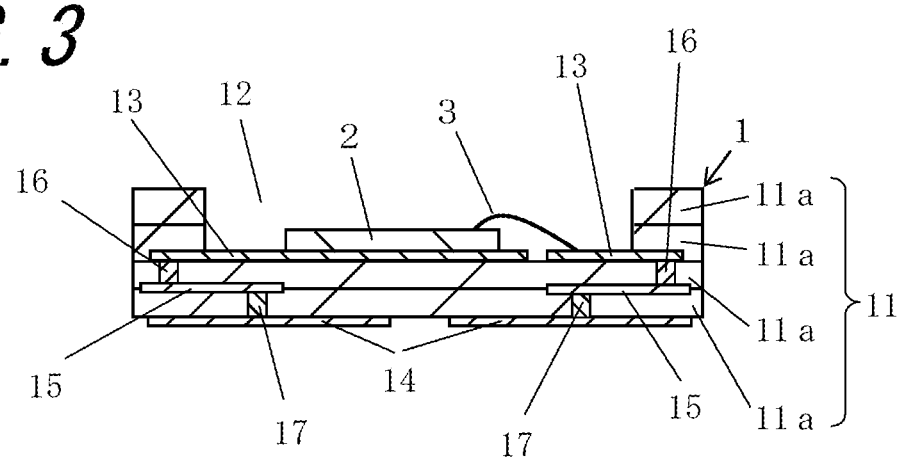
FIG. 3 is a longitudinal sectional view taken along line A-A of the electronic device shown in FIG. 1A.

In the example shown in FIGS. 1A to 2B, the recess 12 is located on the main surface of the insulating substrate 11. The recess 12 is for mounting the electronic component 2 on the bottom surface. In the example shown in FIGS. 1A and 1B, the recess 12 has a rectangular shape with a corner having an arc shape in a plan view, and is disposed in the center portion of the insulating substrate 11. In the example shown in FIGS. 1A to 3, the insulating substrate 11 is formed of four insulating layers 11a, and the recess 12 is disposed in the first and second insulating layers 11a from the main surface side of the insulating substrate 11 in the examples illustrated in FIGS. 1A to 3. FIGS. 2A and 2B are internal top views of the electronic component mounting substrate 1 in the electronic device. FIG. 2A illustrates an upper surface of an insulating layer 11a that is the third in order from the main surface side of the electronic component mounting substrate 1, that is, illustrates the bottom surface of the recess 12. FIG. 2B illustrates an upper surface of an insulating layer 11a that is the fourth in order from the main surface side of the electronic component mounting substrate 1.

For example, the recess 12 may be formed by forming through holes to be the recess 12 in the respective ceramic green sheets by laser processing or punching with a mold in a portion of the ceramic green sheets for the insulating substrate 11, and stacking these ceramic green sheets on the other ceramic green sheet in which no through hole is formed.

The metal layer 13, the external electrode 14, the connection wiring 15, the first vias 16, and the second vias 17 are disposed on the surface of, and within the insulating substrate 11. The metal layer 13, the external electrode 14, the connection wiring 15, the first vias 16, and the second vias 17 are for electrically connecting the electronic component 2 and the module substrate 4. The metal layer 13 is located on the bottom surface of the recess 12 and extends to the lower side of the side wall of the recess 12, as in the example shown in FIGS. 1A to 3. The external electrode 14 is located on the other main surface of the insulating substrate 11, as in the example shown in FIGS. 1A to 3. As in the example shown in FIGS. 1A to 3, the connection wiring 15 is located between the insulating layers 11a between the metal layer 13 and the external electrode 14 in the thickness direction of the insulating substrate 11. As in the example shown in FIGS. 1A to 3, the first vias 16 and the second vias 17 are located between the bottom surface of the recess 12 and the lower surface of the insulating substrate 11 in the thickness direction of the insulating substrate 11. The second vias 17 are located closer to the other main surface side of the insulating substrate 11 than the first vias 16. The first vias 16 are located along the side wall of the recess 12 and connects the metal layer 13 extending to the lower side of the side wall of the recess 12 and the connection wiring 15 in a perspective plan view. The first vias 16 are located in the insulating layer 11a that is the third in order from the main surface side of the insulating substrate 11 in the example shown in FIGS. 1A to 3. The second vias 17 are located in the insulating layer 11a that is the fourth in order from the main surface side of the insulating substrate 11 in the example shown in FIGS. 1A to 3. As in the example shown in FIGS. 1A to 3, the second vias 17 are located inside the side wall of the recess 12, that is, located in a region overlapping the recess 12 in a perspective plan view, and connects the external electrode 14 and the connection wiring 15. The second vias 17 are disposed closer to the center than the first vias 16 in a perspective plan view.

As in the example shown in FIGS. 1A to 3, at least two or more first vias 16 are located along the side wall of the recess 12 in a perspective plan view.

The second vias 17 are located in a strip shape in a perspective plan view as in the example shown in FIGS. 1A to 3. Note that, being located in a strip shape means that at least three or more second vias 17 are located in a line. In the example shown in FIGS. 1A to 3, there are six second vias 17 located in the strip shape.

For example, the metal layer 13, the external electrode 14, the connection wiring 15, the first vias 16, and the second vias 17 are metallization of a metal powder having a main component of tungsten (W), molybdenum (Mo), manganese (Mn), silver (Ag), copper (Cu), and the like, for example. For example, if the insulating substrate 11 is made of an aluminum oxide sintered body, a metallized paste obtained by adding and mixing a suitable organic binder, solvent, and the like to a refractory metal powder such as W, Mo or Mn is preliminarily printed and applied in a predetermined pattern on the ceramic green sheet for the insulating substrate 11 by a screen printing method, and is fired at the same time as the ceramic green sheet for the insulating substrate 11, to be deposited on a predetermined position of the insulating substrate 11. For example, the metal layer 13, the external electrode 14 and the connection wiring 15 are formed by printing and applying the metallized paste for the metal layer 13, the external electrode 14, and the connection wiring 15, on a ceramic green sheet for the insulating substrate 11 by a printing means such as a screen printing method, and firing the result together with the ceramic green sheet for the insulating substrate 11. For example, the first vias 16 and the second vias 17 are formed by forming through holes for a through conductor in a ceramic green sheet for the insulating substrate 11 by the processing method such as punching with mold, or laser processing, and filling the through hole with the metallized paste for the first vias 16 and the second vias 17 by the printing means, and firing the result together with the ceramic green sheet for the insulating substrate 11. The metallized paste is prepared by adjusting the viscosity to an appropriate level by adding a suitable solvent and binder to the metal powder described above and kneading the same. In order to increase the bonding strength with the insulating substrate 11, glass powder or ceramic powder may be included.

A metal plating layer is deposited on a surface of the metal layer 13 and the external electrode 14 exposed from the insulating substrate 11 by electroplating or electroless plating. The metal plating layer is formed of a metal having good corrosion resistance and connection member connectivity, such as nickel, copper, gold, or silver, and is sequentially deposited with a nickel plating layer having a thickness of about 0.5 to 5 µm and a gold plating layer having a thickness of about 0.1 to 3 µm, for example. As a result, the corrosion of the metal layer 13 and the external electrode 14 can be effectively suppressed, and the bonding between the electronic component 2 and the metal layer 13, the bonding between the metal layer 13 and the connection member 3 such as a bonding wire, and the bonding between the external electrode 14 and the connection pad 41 for connection on the module substrate 4 can be strengthened.

The metal plating layer is not limited to the nickel plating layer/gold plating layer, and may be other metal plating layers including nickel plating layer/palladium plating layer/gold plating layer.

An electronic device can be prepared by mounting the electronic component 2 on the bottom surface of the recess 12 of the electronic component mounting substrate 1. The electronic component 2 mounted on the electronic component mounting substrate 1 is, for example, a semiconductor element such as an IC chip or an LSI chip, a light emitting element, a piezoelectric element such as a crystal oscillator or a piezoelectric vibrator, and various sensors. For example, if the electronic component 2 is a wire bonding type semiconductor element, the semiconductor element is fixed to the bottom surface of the recess 12 by a bonding member such as a low melting point brazing material or a conductive resin, and then mounted on the electronic component mounting substrate 1 by electrically connecting the electrode of the semiconductor element and the metal layer 13 through the connection member 3 such as a bonding wire. As a result, the electronic component 2 is electrically connected to the metal layer 13. In addition, if the electronic component 2 is a flip chip type semiconductor element, the semiconductor element is mounted on the electronic component mounting substrate 1 by electrically and mechanically connecting the electrode and the metal layer 13 of the semiconductor element through the connection member 3 such as a solder bump, a gold bump, or a conductive resin (anisotropic conductive resin and the like). In addition, on the bottom surface of the recess 12 of the electronic component mounting substrate 1, a plurality of electronic components 2 may be mounted, or a small electronic component such as a resistor element or a capacitor element may be mounted as necessary. Moreover, the electronic component 2 is sealed using a sealing material made of resin, glass, and the like, or by a cover made of resin, glass, ceramics, metal, and the like, as necessary.

For example, as shown in FIG. 4, the external electrodes 14 of the electronic device according to the present embodiment are connected to the connection pads 41 of the module substrate through the solder 5 to form an electronic module. In the electronic device, for example, as shown in FIG. 4, the external electrodes 14 arranged on the other main surface of the electronic component mounting substrate 1 are connected to the connection pads 41 of the module substrate 4.

The electronic component mounting substrate 1 according to the present embodiment includes the insulating substrate 11 having a recess 12 that opens in a main surface of the insulating substrate 11, the recess for mounting an electronic component 2, the metal layer 13 located on a bottom surface of the recess 12, the external electrode 14 located on the other main surface of the insulating substrate 11, the other main surface opposite to the main surface, the connection wiring 15 located between the metal layer 13 and the external electrode 14 in a thickness direction of the insulating substrate 11, a plurality of first vias 16 that connects the metal layer 13 and the connection wiring 15 and that is located along a side wall of the recess 12 in a perspective plan view, and a plurality of second vias 17 that connects the connection wiring 15 and the external electrode 14 and that is located in a strip shape in the perspective plan view. With the above configuration, a plurality of first vias 16 located on the bottom surface side of the recess 12 is located on an outer periphery side of the recess 12 overlapping the side wall, a plurality of second vias 17 located on the other main surface side and connected to the external electrode 14 is located inward the recess 12 relative to the plurality of first vias 16, and thus a plurality of vias is separately located on the bottom surface side of the recess and the lower surface side of the insulating substrate 11. Accordingly, for example, if the electronic device is operated, the heat sources in the plurality of first vias 16 and the plurality of second vias 17 are separated, and thus the heat generated by the plurality of second vias 17 connected to the external electrode 14 is generated in the vicinity of the center of the insulating substrate 11 and spreads over the entire external electrode 14 along the arrangement of the plurality of second vias 17 to be easily dissipated to the outside. As a result, even if a high current is applied to the plurality of first vias 16 and the plurality of second vias 17, it is possible to reduce stress generated at the outer edge (side surface and lower side surface) of the insulating substrate 11 along the vias and to reduce occurrence of distortion in the insulating substrate 11.

If a light emitting element is used as the electronic component 2, the electronic component mounting substrate 1 for a light emitting device having good luminance can be employed.

The plurality of first vias 16 and the plurality of the second vias 17 are located in the insulating substrate 11, and thus heat generation of the individual via is reduced by suppressing the current applied to an individual via through the metal layer 13 or the external electrode 14. Because there is a plurality of second vias 17 located in a strip shape as in the example shown in FIGS. 1A to 2B, the heat generated by the second vias 17 may be dissipated to the external electrode 14 in the strip shape, and dispersed to the external electrode 14 to facilitate heat transfer, and the heat transfer from the external electrode 14 to the module substrate 4 may be improved, thus resulting in reduced occurrence of distortion in the insulating substrate 11.

The plurality of first vias 16 and the plurality of second vias 17 are connected to one connection wiring 15 as in the example shown in FIG. 2B. As a result, it is possible to suppress a difference between current values applied to respective vias between the plurality of first vias 16 or between the plurality of second vias 17, and reduce the occurrence of large heat generation in the respective vias between the plurality of first vias 16 or between the plurality of second vias 17.

The plurality of first vias 16 is connected to one connection wiring 15 as in the example shown in FIGS. 2A and 2B. If the plurality of first vias 16 overlaps the outer edge of the connection wiring 15 in a perspective plan view, the plurality of first vias 16 is connected to the outer edge of one connection wiring 15, and thus the heat of the plurality of first vias 16 is dispersed in the vicinity of the outer edge of the insulating substrate 11 to facilitate heat dissipation. In addition, the variation in the current value applied to each of the plurality of first vias 16 via one connection wiring 15 is reduced, the occurrence of large heat generation in each of the plurality of first vias 16 is reduced, and thus it is possible to reduce occurrence of distortion in the insulating substrate 11.

If the plurality of first vias 16 and the plurality of second vias 17 are disposed without overlapping the electronic component 2 in a perspective plan view as shown in the examples shown in FIGS. 1A to 4, heat transfer from the electronic component 2 to the first vias 16 and the second vias 17 may be suppressed, and deterioration of the heat generation of the first vias 16 and heat generation of the second vias 17 may be suppressed, thus resulting in reduced occurrence of distortion in the insulating substrate 11.

As in the example shown in FIGS. 1A to 4, if the plurality of first vias 16 and the plurality of second vias 17 are located opposite to each other with a mounting portion of the electronic component 2 being interposed therebetween, heat transfer from the electronic component 2 to the first vias 16 and the second vias 17 in the opposite directions may be suppressed, and deterioration of the heat generation of the first vias 16 and heat generation of the second vias 17 may be suppressed, thus resulting in reduced occurrence of distortion in the insulating substrate 11.

Further, as shown in the examples shown in FIGS. 1A to 4, if the connection wirings 15 are located opposite to each other with the mounting portion of the electronic component 2 being interposed therebetween, the variation in the current value applied to each of the plurality of first vias 16 in the opposite directions is reduced, and the occurrence of large heat generation in each of the plurality of first vias 16 is reduced, thus resulting in reduced occurrence of distortion in the insulating substrate 11.

The electronic device according to the present embodiment includes the electronic component mounting substrate 1 having the configuration described above and the electronic component 2 mounted in the recess 12 of the electronic component mounting substrate 1, and as a result, an electronic device with increased long-term reliability can be obtained.

The electronic module according to the present embodiment includes the module substrate 4 having the connection pads 41, and the electronic device having the configuration described above connected to the external electrode 14 through the solder on the connection pad 41, thereby providing the increased long-term reliability.

The electronic component mounting substrate 1 according to the present embodiment can be suitably used in a small and high-power electronic device. For example, if a light emitting element such as an LED is mounted on the bottom surface of the recess 12 as the electronic component 2, the electronic component mounting substrate 1 may be suitably used for a thin and high-luminance light emitting device.

Second Embodiment

Next, an electronic device according to a second embodiment will be described with reference to FIGS. 5A to 7B.

The electronic device according to the second embodiment is different from the electronic device according to the embodiment described above in that a notch 11b is disposed in a side surface of the insulating substrate 11, and the connection wiring 15 includes a protrusion 15a protruding to the side surface where the notch 11b is located in a perspective plan view. In the example shown in FIGS. 5A to 7B, the insulating substrate 11 is formed of four insulating layers 11a, and the recess 12 is disposed in the first and second insulating layers 11a of the upper surface side of the insulating substrate 11 in the examples illustrated in FIGS. 5A to 7B. FIGS. 6A and 6B are internal top views of the electronic component mounting substrate 1 in the electronic device. FIG. 6A illustrates an upper surface of the insulating layer 11a that is the third in order from the main surface side of the electronic component mounting substrate 1, that is, illustrates a bottom surface of the recess 12. FIG. 6B illustrates an upper surface of the insulating layer 11a that is the fourth in order from the main surface side of the electronic component mounting substrate 1.

Figure 5A:
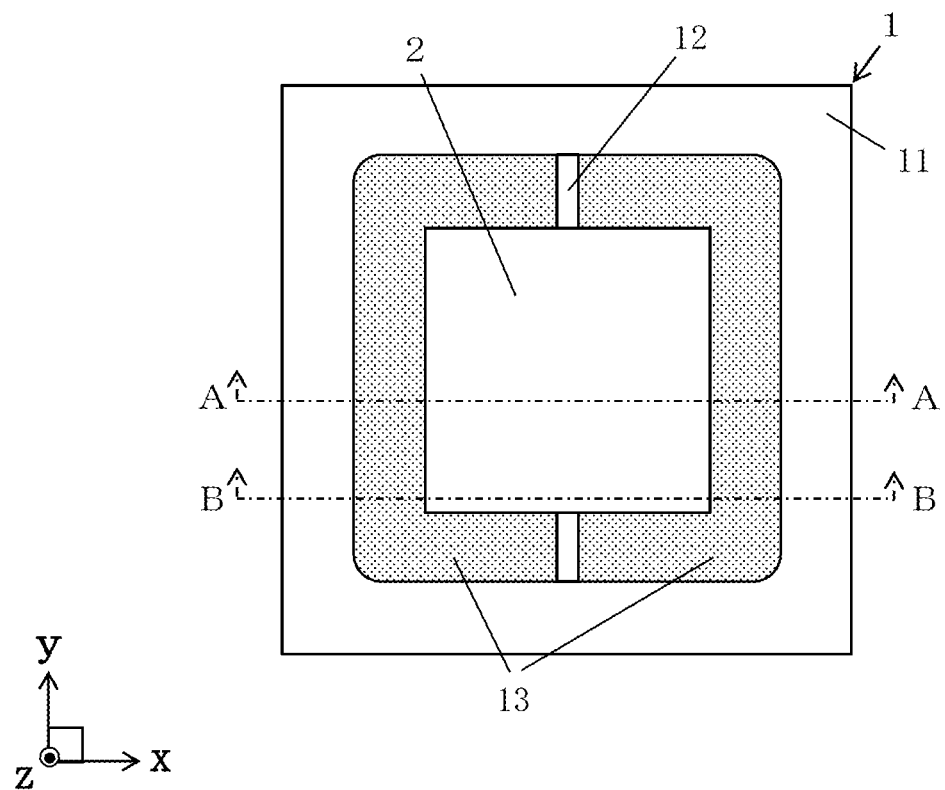
FIG. 5A is a top view showing an electronic device according to a second embodiment.
Figure 5B:
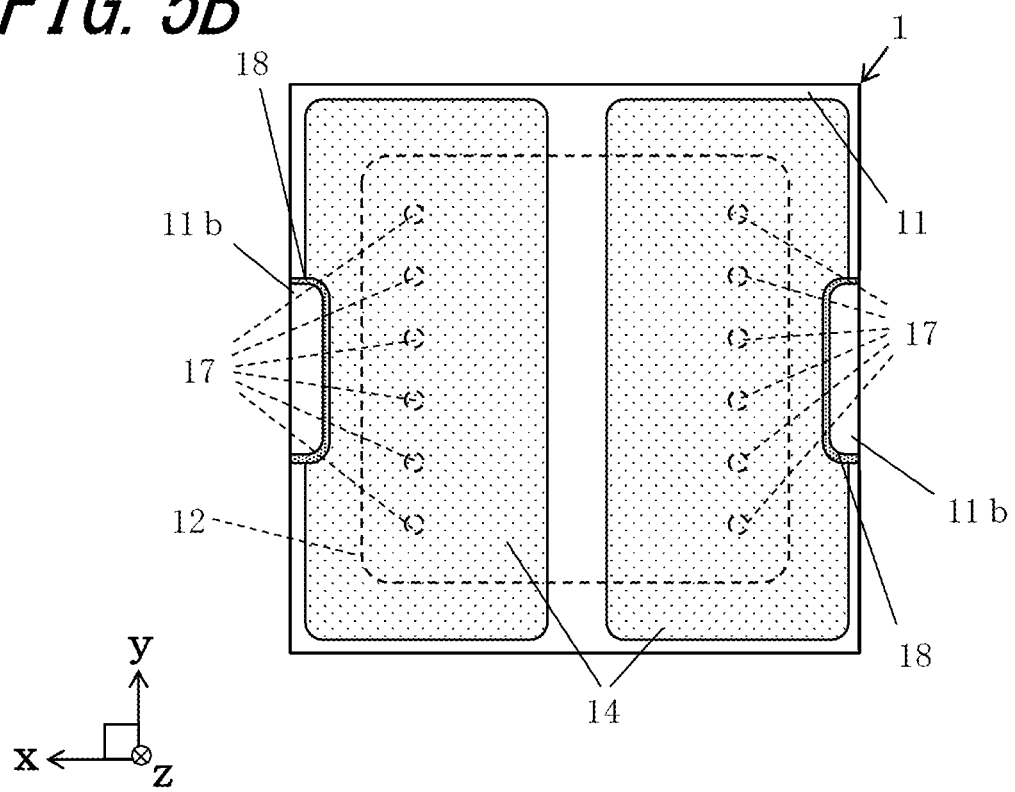
FIG. 5B is a bottom view of FIG. 5A.
Figure 6A:
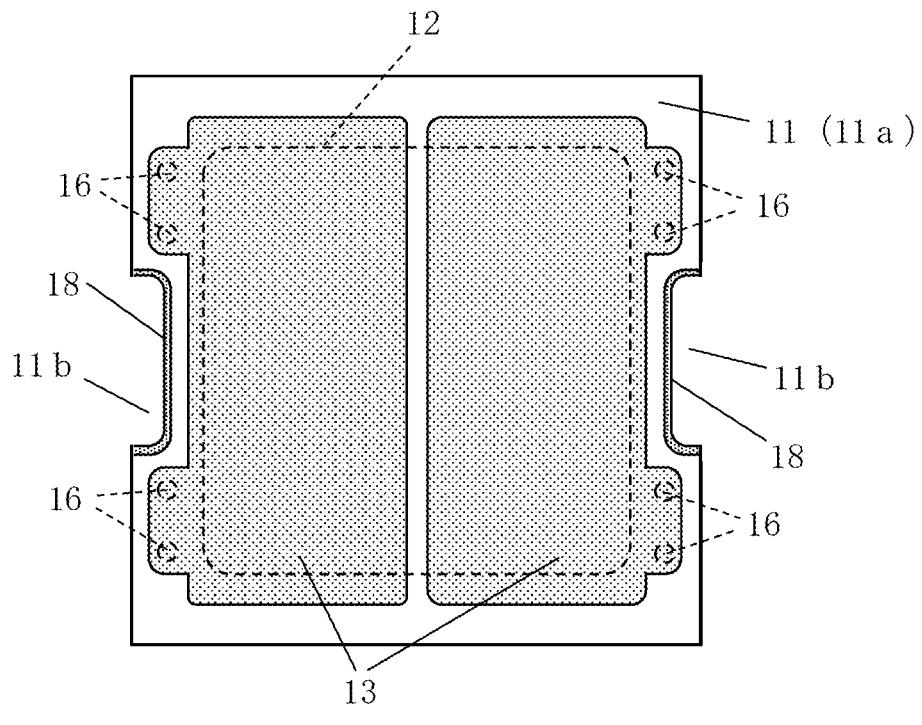
FIGS. 6A and 6B are internal top views showing an electronic component mounting substrate in the electronic device shown in FIGS. 5A and 5B.
Figure 6B:
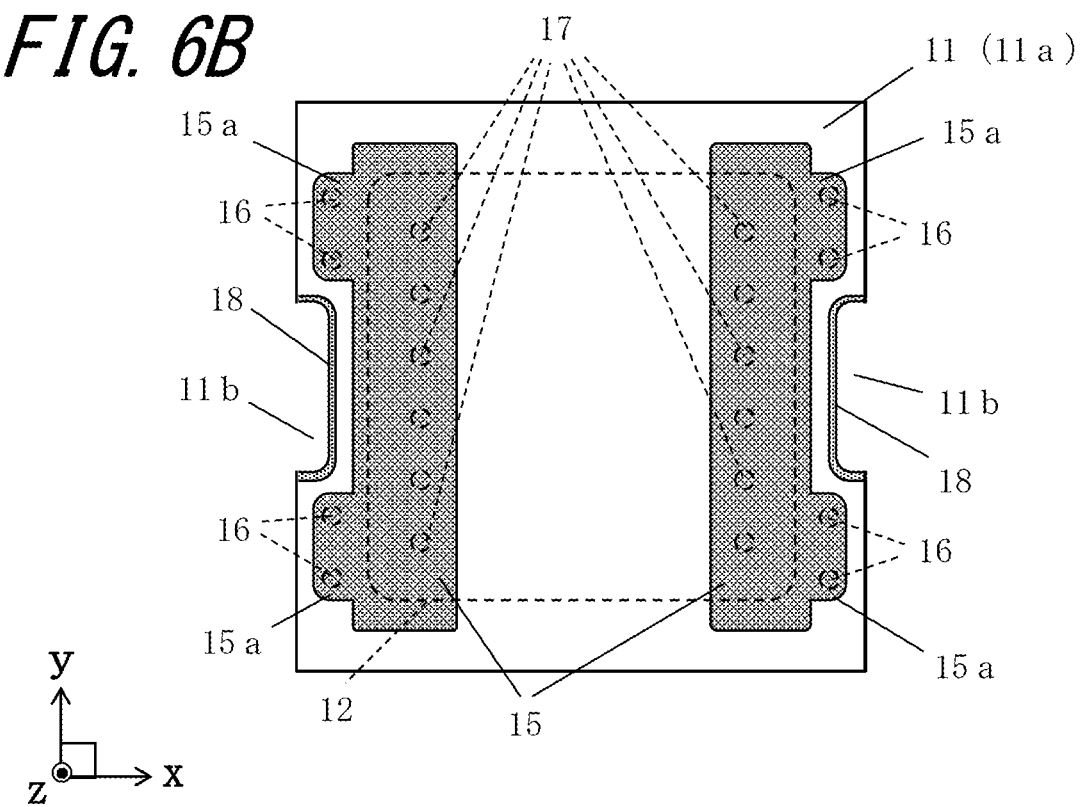
Figure 7A:
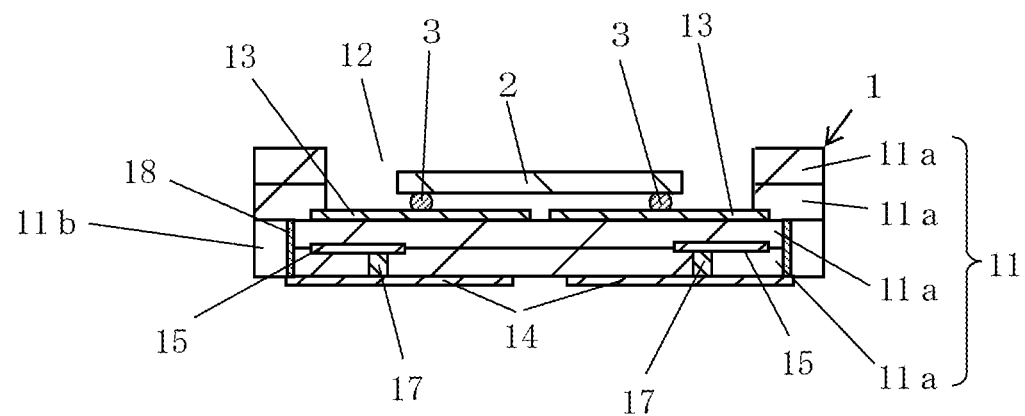
FIG. 7A is a longitudinal sectional view taken along line A-A of the electronic device shown in FIG. 5A.
Figure 7B:
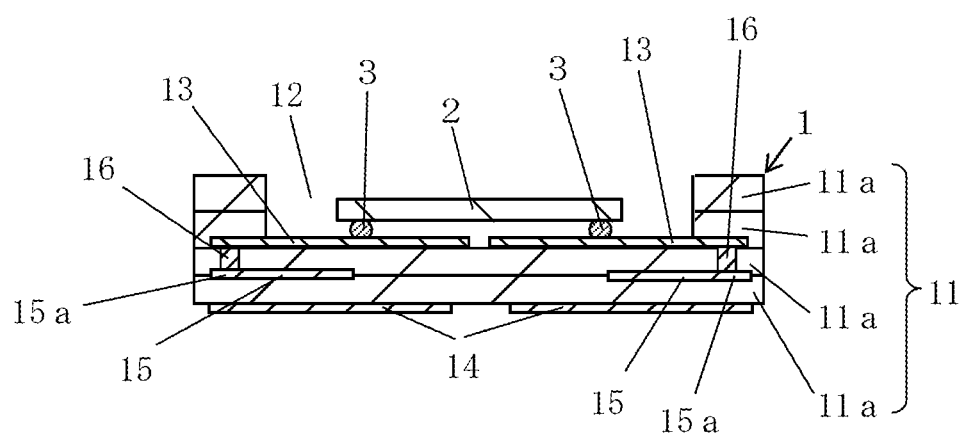
FIG. 7B is a longitudinal sectional view taken along line B-B.

In the example shown in FIG. 5B, in a perspective plan view, a portion that overlaps the inner wall of the recess 12 and portions that overlap the side surfaces of the second vias 17 are indicated by dotted lines. In the example shown in FIG. 6A, in a perspective plan view, a portion that overlaps the inner wall of the recess 12 and portions that overlap the side surfaces of the first vias 16 are indicated by dotted lines. In the example shown in FIG. 6B, a portion that overlaps the inner wall of the recess 12, and portions that overlap the side surfaces of the first vias 16 and the side surfaces of the second vias 17 are indicated by dotted lines.

According to the electronic component mounting substrate according to the second embodiment, like the electronic component mounting substrate 1 according to the first embodiment, a plurality of first vias 16 located on the bottom surface side of the recess 12 is located on the outer periphery side of the recess 12 overlapping the side wall, a plurality of second vias 17 located on the other main surface side and connected to the external electrode 14 is located further inward the recess 12 than the plurality of first vias 16, and thus a plurality of vias is separately arranged on the bottom surface side of the recess 12 and the lower surface side of the insulating substrate 11. Accordingly, for example, if the electronic device is operated, the heat sources in the plurality of first vias 16 and the plurality of second vias 17 are separated, and thus the heat generated by the plurality of second vias 17 connected to the external electrode 14 is generated in the vicinity of the center of the insulating substrate 11 and spreads over the entire external electrode 14 along the arrangement of the plurality of second vias 17 to be easily dissipated to the outside. As a result, even if a high current is applied to the plurality of first vias 16 and the plurality of second vias 17, it is possible to reduce stress generated at the outer edge (side surface and lower side surface) of the insulating substrate 11 along the vias and to reduce occurrence of distortion in the insulating substrate 11.

The connection wiring 15 includes a protrusion 15a protruding to the side surface where the notch 11b is located. Accordingly, the heat transferred to the connection wiring 15 from the plurality of first vias 16 is dispersed and easily dissipated to the notch 11b side, and thus it is possible to reduce occurrence of distortion in the insulating substrate 11.

If the plurality of first vias 16 overlaps the protrusions 15a in a perspective plan view, the plurality of first vias 16 is connected to the protrusions 15a of one connection wiring 15, and thus the heat of the plurality of first vias 16 may be dispersed in the vicinity of the notch 11b of the insulating substrate 11 and may be easily dissipated to the notch 11b. As a result, the occurrence of distortion in the insulating substrate 11 may be reduced.

The notch 11b is located in the side surface of the insulating substrate 11 in the thickness direction of the insulating substrate 11. In the example shown in FIGS. 5A to 7B, one notch 11b is located in each of two opposite to side surfaces of the insulating substrate 11. In the example shown in FIGS. 5A to 7B, the notch 11b is located in the insulating layer 11a between the bottom surface of the recess 12 and the other main surface of the insulating substrate 11, but may penetrate the insulating substrate 11 in the thickness direction.

The notch 11b may be manufactured by the same method as that for the recess 12 described above. For example, it may be formed by forming through holes to be the notch 11b in the respective ceramic green sheets by laser processing or punching with a mold in a portion of the ceramic green sheets for the insulating substrate 11 and by stacking these ceramic green sheets on another ceramic green sheet in which no through hole is formed.

A side conductor 18 is disposed on an inner surface of the notch 11b. The end of the side conductor 18 is connected to the external electrode 14, and may be connected to the connection pad 41 of the module substrate 4 through the solder 5 together with the external electrode 14.

If the connection wiring 15 includes the protrusion 15a protruding to the side surface where the notch 11b is located and the solder 5 is connected to the side conductor 18 of the notch 11b, the heat of the plurality of first vias 16 may be dispersed in the vicinity of the notch 11b of the insulating substrate 11 to be easily dissipated to the notch 11b where the side conductor 18 and the solder 5 are disposed, thus resulting in reduced occurrence of distortion in the insulating substrate 11.

The side conductor 18 may be formed by the same material and method as the metal layer 13, the external electrode 14 and the connection wiring 15 described above. For example, it is formed by applying by printing a metallized paste for the side conductor 18 onto the through hole for the notch 11b disposed in the ceramic green sheet for the insulating substrate 11, by a printing means such as a screen printing method, and firing the result together with a ceramic green sheet for the insulating substrate 11. A metal plating layer is disposed on the exposed surface of the side conductor 18 to strengthen the connection with the connection pad 41 for connection purpose formed on the module substrate 4 together with the external electrode 14.

In the example shown in FIGS. 5A to 7B, two (a pair) of the plurality of first vias 16 are arranged respectively in two protrusions 15a (two regions) located with the notch 11b being interposed therebetween. The number of the first vias 16 located in the respective regions of the two protrusions 15a may be the same as each other, and the currents applied to the respective regions of the two protrusions 15a, that is, to the respective protrusions 15a and the plurality of first vias 16, are equally distributed.

The protrusions 15a are located with the notch 11b being interposed therebetween. Accordingly, the heat generated by the plurality of first vias 16 and the connection wiring is well dispersed to the notch 11b, and thus it is possible to reduce occurrence of distortion in the insulating substrate 11. The interval between each of the two protrusions 15a (two regions) and the notch 11b may be formed by an equal interval within a range of 10%.

As in the example shown in FIGS. 5A to 7B, if the plurality of first vias 16 and the plurality of second vias 17 are located opposite to each other with the mounting portion of the electronic component 2 being interposed therebetween, heat transfer from the electronic component 2 to the first vias 16 and the second vias 17 in the opposite directions may be suppressed, and deterioration of the heat generation of the first vias 16 and heat generation of the second vias 17 may be suppressed, thus resulting in reduced occurrence of distortion in the insulating substrate 11.

As shown in the examples shown in FIGS. 5A to 7B, if the connection wiring 15 and the protrusion 15a are located opposite to each other with the mounting portion of the electronic component 2 being interposed therebetween, the variation in the current value applied to each of the plurality of first vias 16 in the opposite directions is reduced, and the occurrence of large heat generation in each of the plurality of first vias 16 is reduced, thus resulting in reduced occurrence of distortion in the insulating substrate 11.

If the plurality of first vias 16 and the plurality of second vias 17 are located without overlapping the electronic component 2 in a perspective plan view as shown in the examples shown in FIGS. 5A to 7B, like the electronic component mounting substrate 1 according to the first embodiment, heat transfer from the electronic component 2 to the first vias 16 and the second vias 17 may be suppressed, and deterioration of the heat generation of the first vias 16 and heat generation of the second vias 17 may be suppressed, thus resulting in reduced occurrence of distortion in the insulating substrate 11.

The electronic component mounting substrate 1 according to the second embodiment may be manufactured using the same manufacturing method as the electronic component mounting substrate 1 according to the embodiment described above.

Third Embodiment

Next, an electronic device according to a third embodiment will be described with reference to FIGS. 8A to 10B. The electronic device according to the third embodiment is different from the electronic device according to the embodiment described above in that the plurality of first vias 16 is located to surround the plurality of second vias 17 in a perspective plan view. In the example shown in FIGS. 8A to 10B, the insulating substrate 11 is formed of four insulating layers 11a, and the recess 12 is located in the first and second insulating layers 11a of the upper surface side of the insulating substrate 11 in the examples illustrated in FIGS. 8A to 10B. FIGS. 9A and 9B are internal top views of the electronic component mounting substrate 1 in the electronic device. FIG. 9A illustrates an upper surface of the insulating layer 11a that is the third in order from the electronic component mounting substrate 1, that is, illustrates the bottom surface of the recess 12. FIG. 9B illustrates an upper surface of the insulating layer 11*a* that is the fourth in order from the electronic component mounting substrate 1.

Figure 8A:
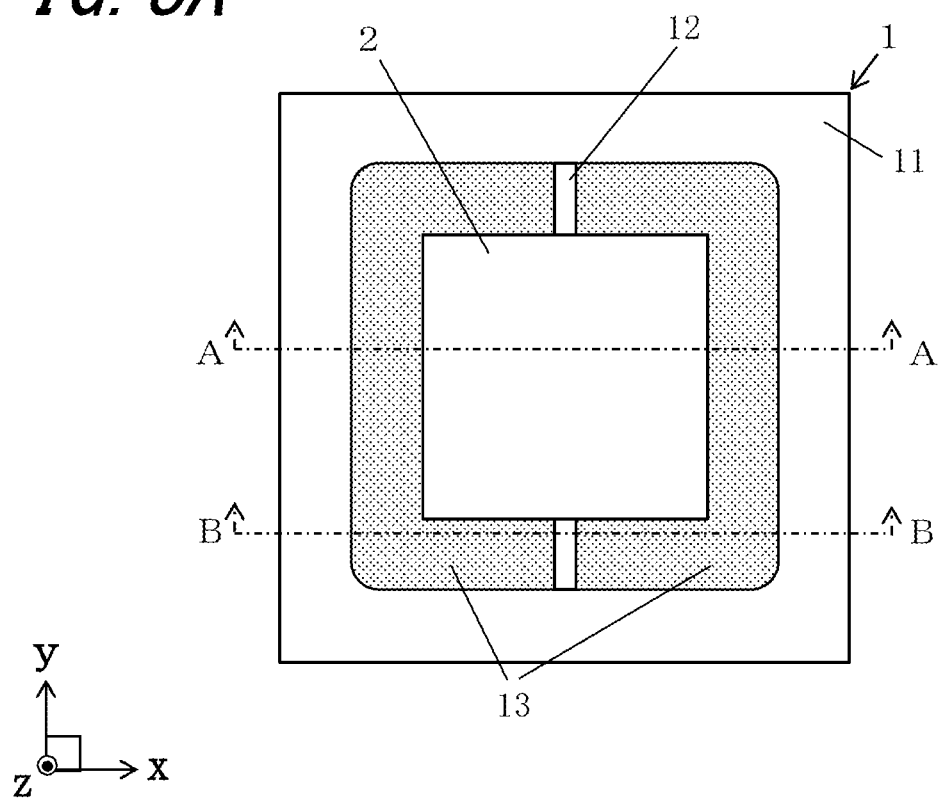
FIG. 8A is a top view showing an electronic device according to a third embodiment.
Figure 8B:
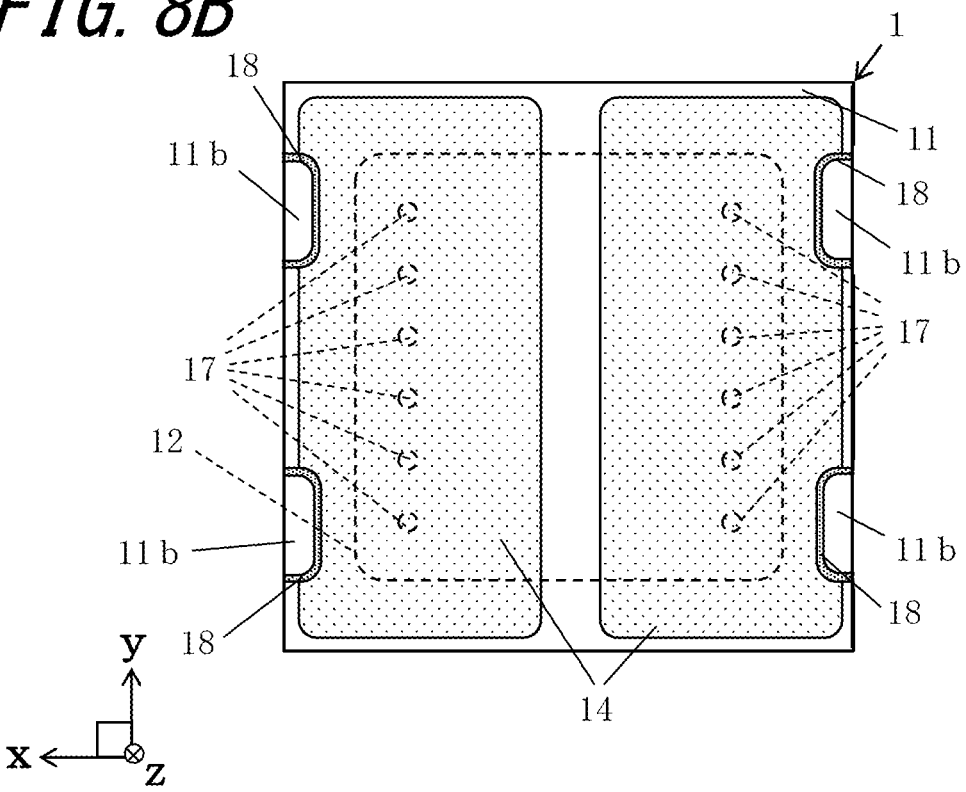
FIG. 8B is a bottom view of FIG. 8A.
Figure 9A:
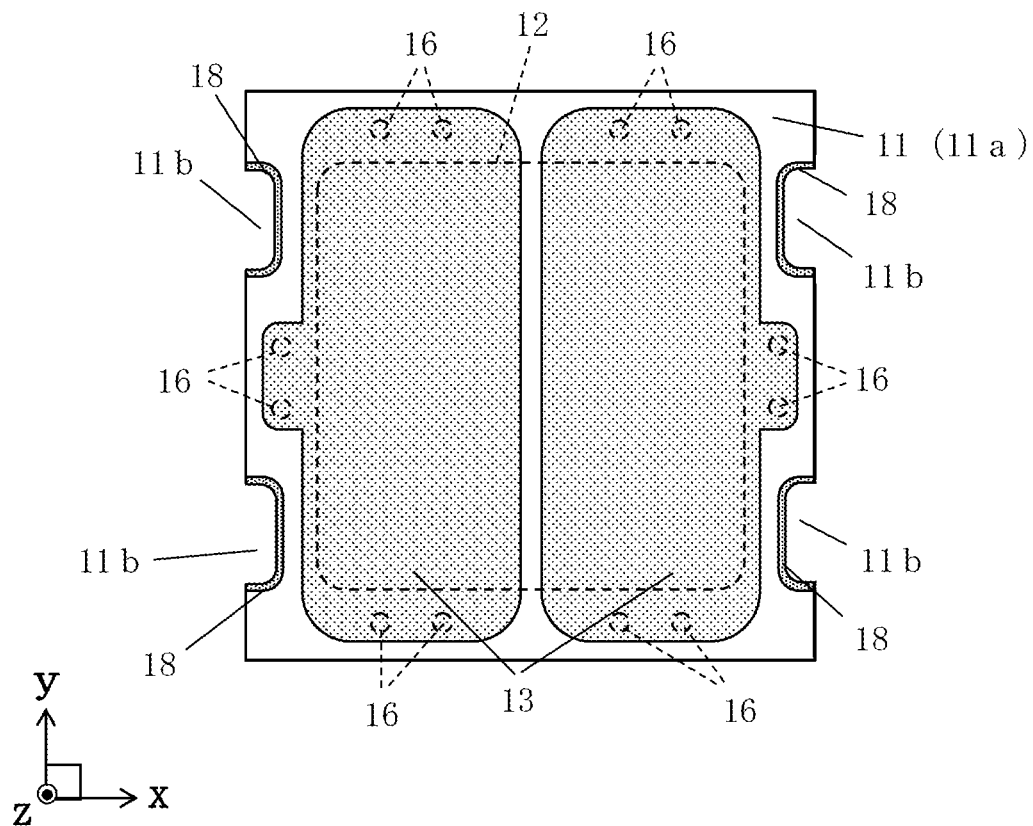
FIGS. 9A and 9B are internal top views showing the electronic component mounting substrate in the electronic device shown in FIGS. 8A and 8B.
Figure 9B:
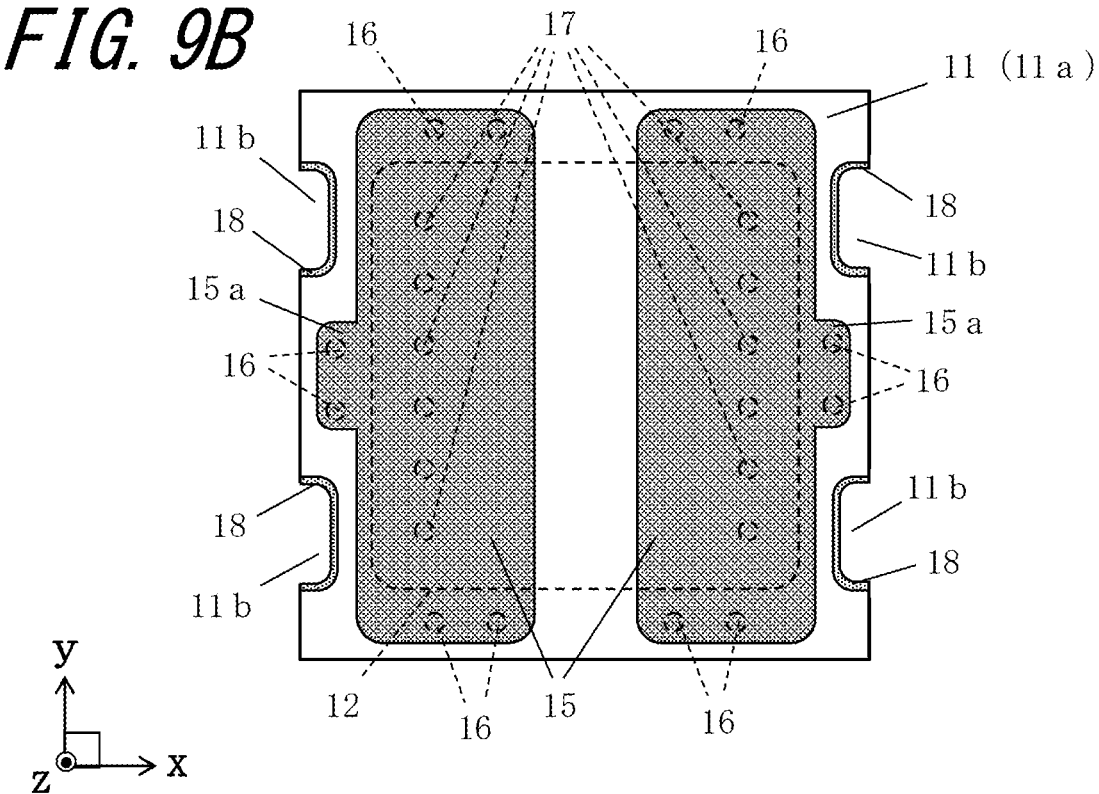
Figure 10A:
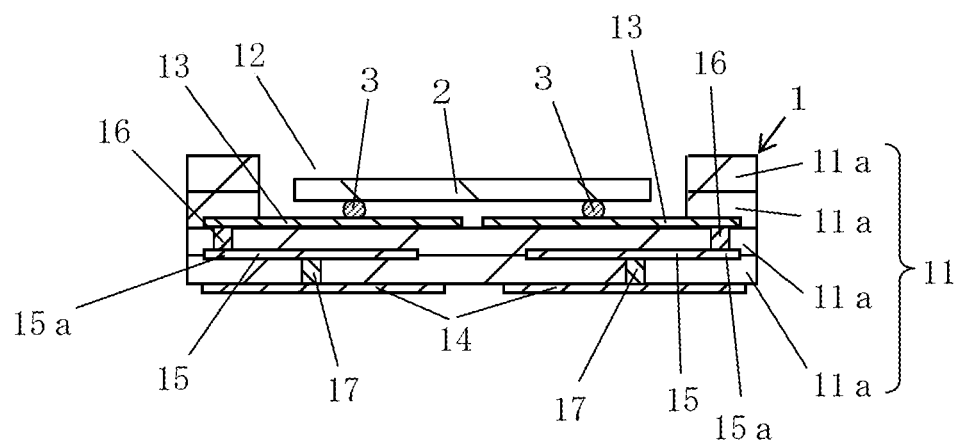
FIG. 10A is a longitudinal sectional view taken along line A-A of the electronic device shown in FIG. 8A.
Figure 10A:
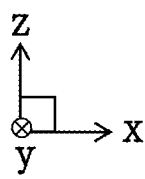
Figure 10B:
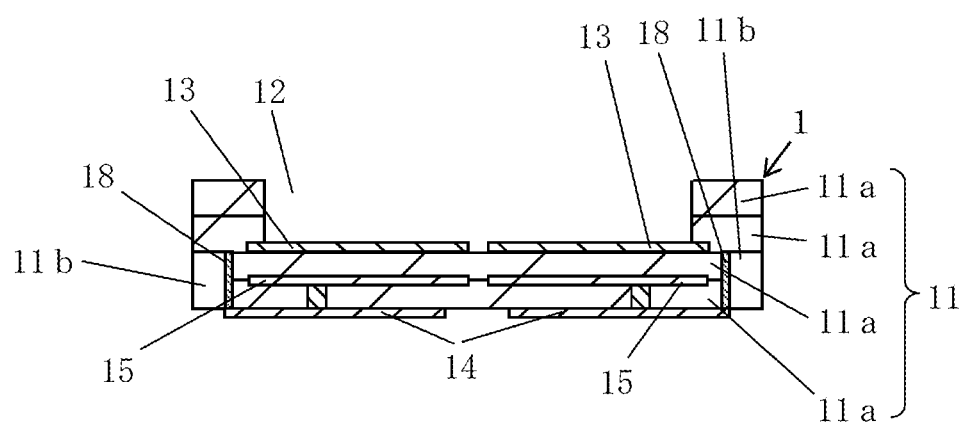
FIG. 10B is a longitudinal sectional view taken along line B-B thereof.
Figure 10B:
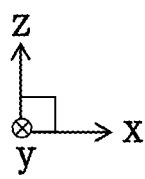

In the example shown in FIG. 8B, in a perspective plan view, a portion that overlaps the inner wall of the recess 12 and portions that overlap the side surfaces of the second vias 17 are indicated by dotted lines. In the example shown in FIG. 9A, in a perspective plan view, a portion that overlaps the inner wall of the recess 12 and portions that overlap the side surfaces of the first vias 16 are indicated by dotted lines. In the example shown in FIG. 9B, a portion that overlaps the inner wall of the recess 12, and portions that overlap the side surfaces of the first vias 16 and the side surfaces of the second vias 17 are indicated by dotted lines.

According to the electronic component mounting substrate according to the third embodiment, like the electronic component mounting substrate 1 according to the first embodiment, a plurality of first vias 16 located on the bottom surface side of the recess 12 is located on the outer periphery side of the recess 12 overlapping the side wall, a plurality of second vias 17 located on the other main surface side and connected to the external electrode 14 is located further inward the recess 12 than the plurality of first vias 16, and thus a plurality of vias is separately located on the bottom surface side of the recess 12 and the lower surface side of the insulating substrate 11. Accordingly, for example, if the electronic device is operated, the heat sources in the plurality of first vias 16 and the plurality of second vias 17 are separated, and thus the heat generated by the plurality of second vias 17 connected to the external electrode 14 is generated in the vicinity of the center of the insulating substrate 11 and spreads over the entire external electrode 14 along the arrangement of the plurality of second vias 17 to be easily dissipated to the outside. As a result, even if a high current is applied to the plurality of first vias 16 and the plurality of second vias 17, it is possible to reduce stress generated at the outer edge (side surface and lower side surface) of the insulating substrate 11 along the vias and to reduce occurrence of distortion in the insulating substrate 11.

If a light emitting element is used as the electronic component 2, the electronic component mounting substrate 1 for a light emitting device having good luminance can be employed.

The plurality of first vias 16 surrounds the plurality of second vias 17. Accordingly, the current is distributed to the plurality of first vias 16 through the metal layer 13 or the connection wiring 15, and thus stress applied to the first vias 16 is dispersed in multiple directions. As a result, even if a high current is applied to the first vias 16 and the second vias 17, it is possible to reduce occurrence of distortion in the insulating substrate 11.

In the example shown in FIGS. 8A to 10B, two (a pair) of the plurality of first vias 16 are respectively located on three sides (three regions) of the insulating substrate 11. If there are equal number of first vias 16 located in each region of the three sides (three regions) of the insulating substrate 11, even if a high current is applied to the first vias 16 and the second vias 17, it is evenly distributed in the three regions, thus resulting in reduced occurrence of distortion in the insulating substrate 11.

As in the example shown in FIGS. 5A to 7B, if the plurality of first vias 16 and the plurality of second vias 17 are located opposite to each other with the mounting portion of the electronic component 2 being interposed therebetween, heat transfer from the electronic component 2 to the first vias 16 and the second vias 17 in the opposite directions may be suppressed, and deterioration of the heat generation of the first vias 16 and heat generation of the second vias 17 may be suppressed, thus resulting in reduced occurrence of distortion in the insulating substrate 11.

As shown in the examples shown in FIGS. 5A to 7B, if the connection wiring 15 and the protrusion 15*a* are located opposite to each other with the mounting portion of the electronic component 2 being interposed therebetween, the variation in the current value applied to each of the plurality of first vias 16 in the opposite directions is reduced, and the occurrence of large heat generation in each of the plurality of first vias 16 is reduced, thus resulting in reduced occurrence of distortion in the insulating substrate 11.

Also in the electronic component mounting substrate 1 according to the third embodiment, like the electronic component mounting substrate 1 according to the first embodiment, a plurality of first vias 16 and second vias 17 are connected to one connection wiring 15 disposed between the insulating layers.

As in the examples shown in FIGS. 8A to 10B, if the number of the plurality of first vias 16 is greater than the number of the plurality of second vias 17, the number of first vias 16 closer to the electronic component 2 is increased, the heat generation from individual vias is reduced, and thus the overall stress applied to the vias is distributed. As a result, even if a high current is applied to the first vias 16 and the second vias 17, the occurrence of distortion in the insulating substrate 11 may be reduced.

As in the examples shown in FIGS. 8A to 10B, if the total area of the plurality of first vias 16 is smaller than the total area of the plurality of second vias 17, the area of first vias 16 closer to the electronic component 2 is increased, and thus the heat generation from the individual vias is reduced and the overall stress applied to the vias is distributed. As a result, even if a high current is applied to the first vias 16 and the second vias 17, the occurrence of distortion in the insulating substrate 11 may be reduced.

If the plurality of first vias 16 and the plurality of second vias 17 are located without overlapping the electronic component 2 in a perspective plan view as shown in the examples shown in FIGS. 8A to 10B, like the electronic component mounting substrate 1 according to the first embodiment, heat transfer from the electronic component 2 to the first vias 16 and the second vias 17 may be suppressed, and deterioration of the heat generation of the first vias 16 and heat generation of the second vias 17 may be suppressed, thus resulting in reduced occurrence of distortion in the insulating substrate 11.

The electronic component mounting substrate 1 according to the third embodiment may be manufactured using the same manufacturing method as the electronic component mounting substrate 1 according to the embodiment described above.

Fourth Embodiment

Next, an electronic device according to a fourth embodiment will be described with reference to FIGS. 11A to 13B. The electronic device according to the fourth embodiment is different from the electronic device according to the embodiment described above in that the recess 12 is circular in a perspective plan view. In the example shown in FIGS. 11A to 13B, the insulating substrate 11 is formed of four insulating layers 11*a*, and the recess 12 is located in the first and second insulating layers 11*a* of the upper surface side of the insulating substrate 11 in the examples illustrated in FIGS.

Figure 12A:
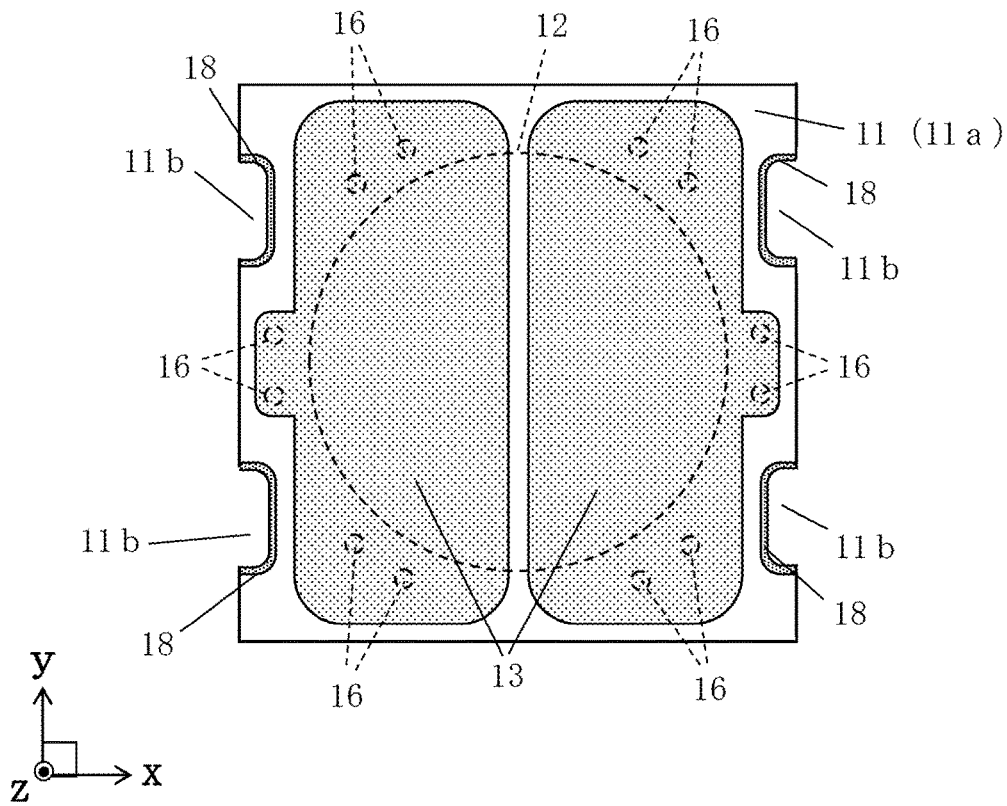
FIGS. 12A and 12B are internal top views of the electronic component mounting substrate in the electronic device shown in FIGS. 11A and 11B.
Figure 12B:
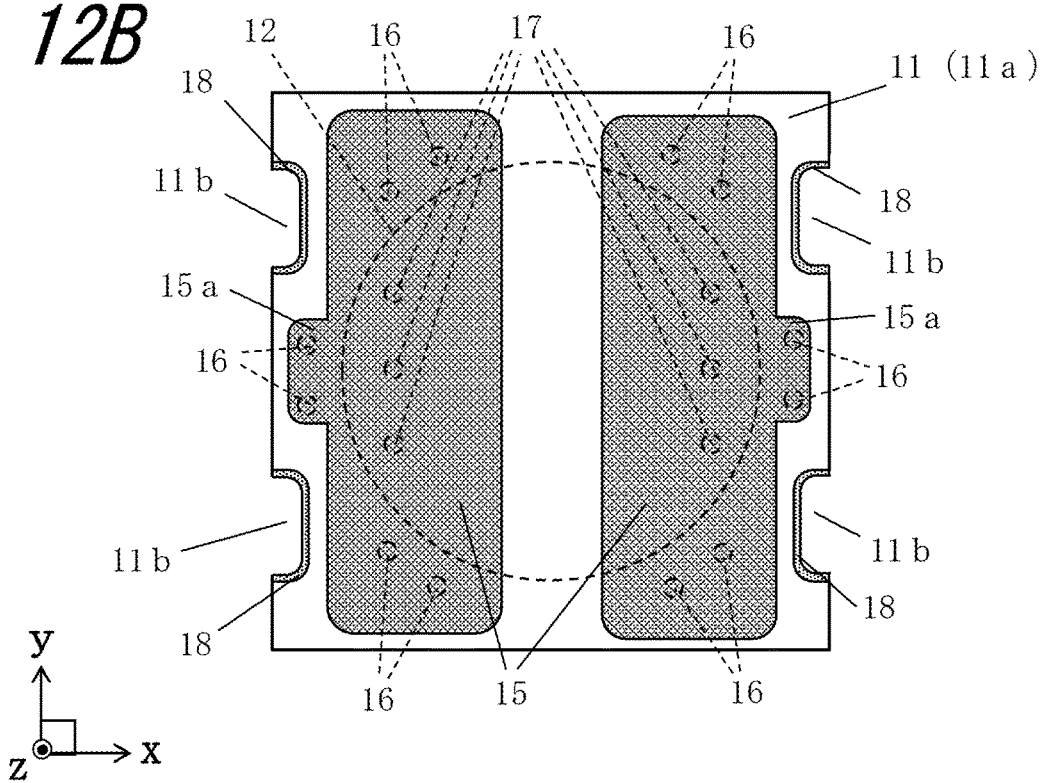
Figure 13A:
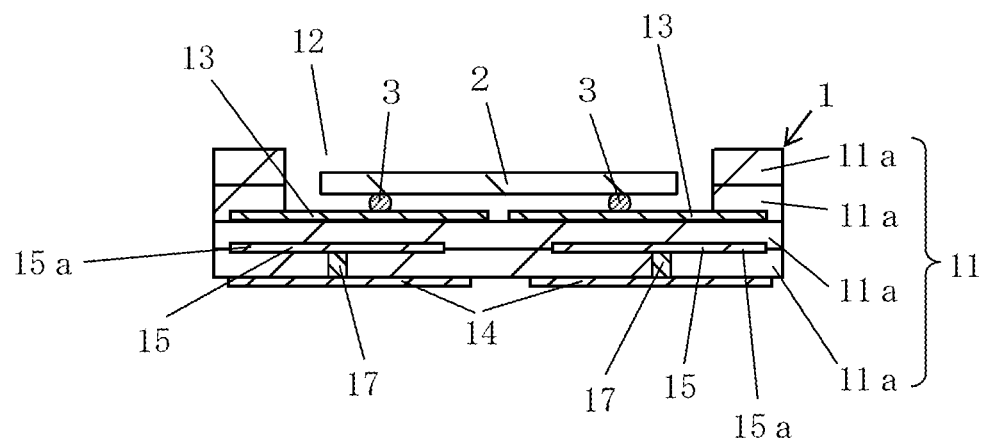
FIG. 13A is a longitudinal sectional view taken along line A-A of the electronic device shown in FIG. 11A.
Figure 13B:
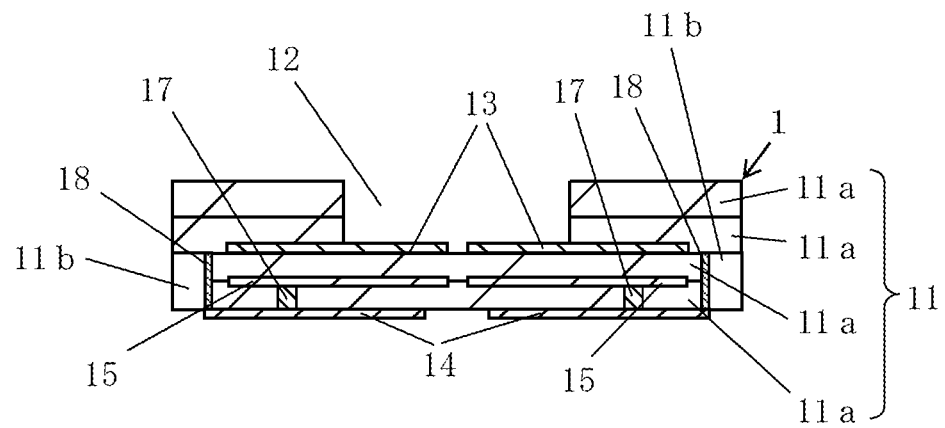
FIG. 13B is a longitudinal sectional view taken along line B-B thereof.

11A to 13B. FIGS. 12A and 12B are internal top views of the electronic component mounting substrate 1 in the electronic device. FIG. 12A illustrates an upper surface of the insulating layer 11a that is the third in order from the electronic component mounting substrate 1, that is, illustrates the bottom surface of the recess 12. FIG. 12B illustrates an upper surface of the insulating layer 11a that is the fourth in order from the electronic component mounting substrate 1.

Figure 11A:
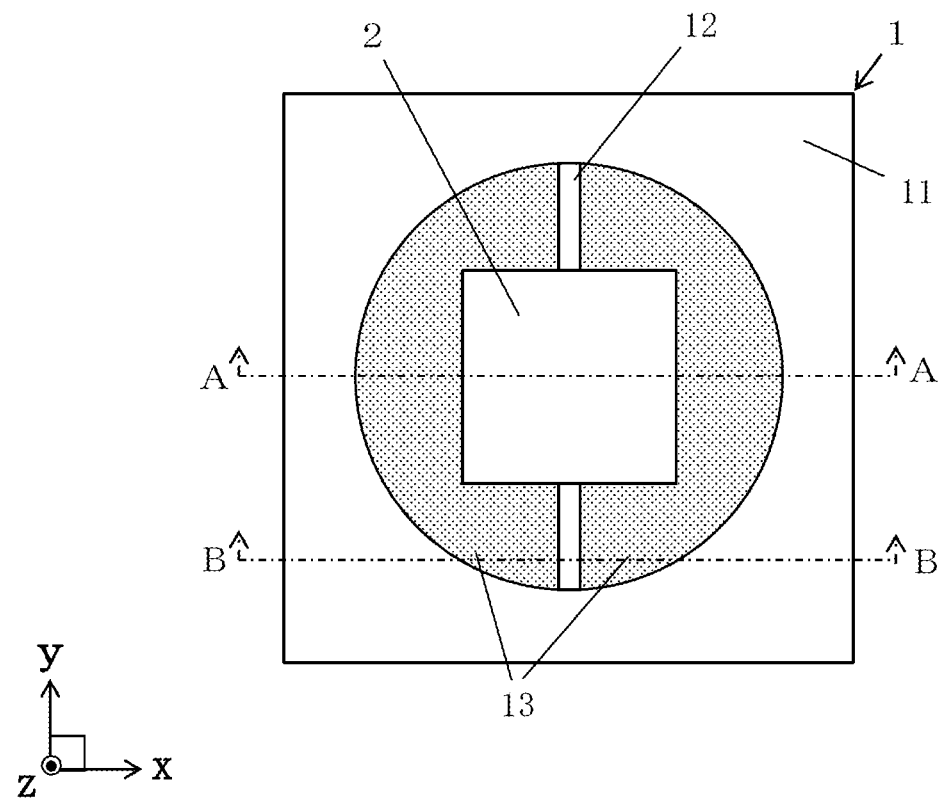
FIG. 11A is a top view showing an electronic device according to a fourth embodiment.
Figure 11B:
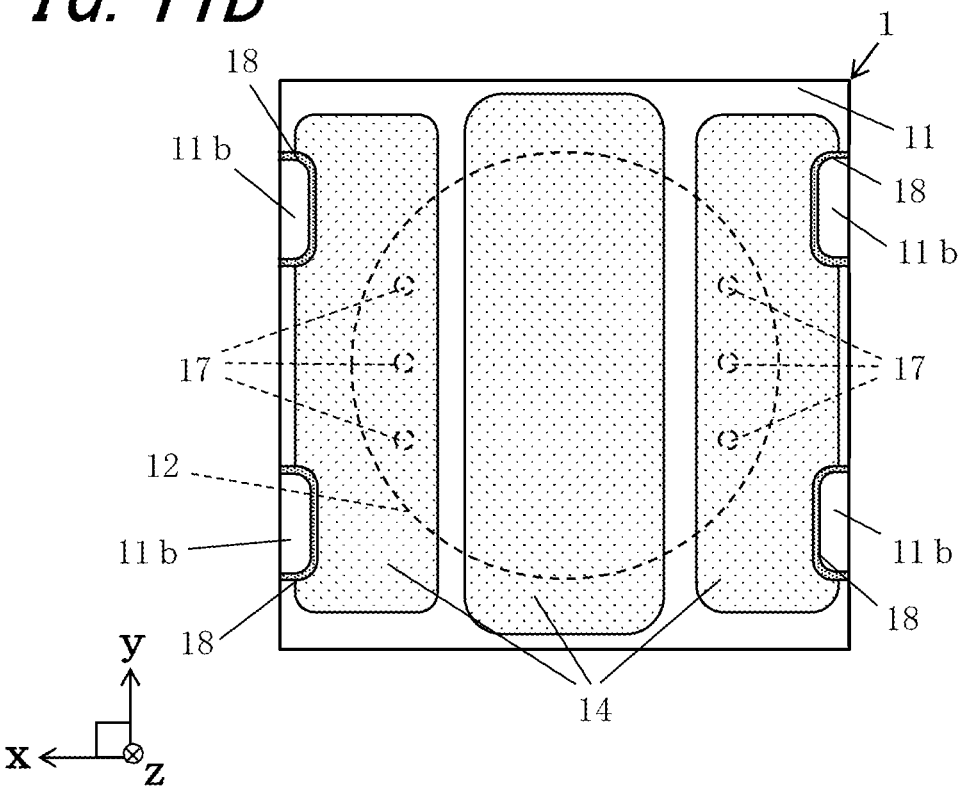
FIG. 11B is a bottom view of FIG. 11A.

In the example shown in FIG. 11B, in a perspective plan view, a portion that overlaps the inner wall of the recess 12 and portions that overlap the side surfaces of the second vias 17 are indicated by dotted lines. In the example shown in FIG. 12A, in a perspective plan view, a portion that overlaps the inner wall of the recess 12 and portions that overlap the side surfaces of the first vias 16 are indicated by dotted lines. In the example shown in FIG. 12B, a portion that overlaps the inner wall of the recess 12, and portions that overlap the side surfaces of the first vias 16 and the side surfaces of the second vias 17 are indicated by dotted lines.

According to the electronic component mounting substrate according to the fourth embodiment, like the electronic component mounting substrate 1 according to the first embodiment, a plurality of first vias 16 located on the bottom surface side of the recess 12 is located on the outer periphery side of the recess 12 overlapping the side wall, a plurality of second vias 17 located on the other main surface side and connected to the external electrode 14 is located further inward the recess 12 than the plurality of first vias 16, and thus a plurality of vias is separately located on the bottom surface side of the recess 12 and the lower surface side of the insulating substrate 11. Accordingly, for example, if the electronic device is operated, the heat sources in the plurality of first vias 16 and the plurality of second vias 17 are separated, and thus the heat generated by the plurality of second vias 17 connected to the external electrode 14 is generated in the vicinity of the center of the insulating substrate 11 and spreads over the entire external electrode 14 along the arrangement of the plurality of second vias 17 to be easily dissipated to the outside. As a result, even if a high current is applied to the plurality of first vias 16 and the plurality of second vias 17, it is possible to reduce stress generated at the outer edge (side surface and lower side surface) of the insulating substrate 11 along the vias and to reduce occurrence of distortion in the insulating substrate 11.

If a light emitting element is used as the electronic component 2, the electronic component mounting substrate 1 for a light emitting device having good luminance can be employed.

In the electronic component mounting substrate 1 according to the fourth embodiment, the plurality of first vias 16 is located along the side wall of the circular recess 12 in a perspective plan view.

As in the example shown in FIGS. 11A to 13B, if the plurality of first vias 16 and the plurality of second vias 17 are located opposite to each other with the mounting portion of the electronic component 2 being interposed therebetween, heat transfer from the electronic component 2 to the first vias 16 and the second vias 17 in the opposite directions may be suppressed, and deterioration of the heat generation of the first vias 16 and heat generation of the second vias 17 may be suppressed, thus resulting in reduced occurrence of distortion in the insulating substrate 11.

As shown in the examples shown in FIGS. 11A to 13B, if the connection wiring 15 and the protrusion 15a are located opposite to each other with the mounting portion of the electronic component 2 being interposed therebetween, the variation in the current value applied to each of the plurality of first vias 16 in the opposite directions is reduced, and the occurrence of large heat generation in each of the plurality of first vias 16 is reduced, thus resulting in reduced occurrence of distortion in the insulating substrate 11.

In addition, the external electrode 14 includes three external electrodes 14 in the examples shown in FIGS. 11A to 13B. The two external electrodes 14 located on the outer side are connected to the plurality of second vias 17, respectively. The external electrode 14 located closer to the center may be electrically connected to one of the other two external electrodes 14 located on the outer side and disposed with the plurality of second vias 17.

If the plurality of first vias 16 and the plurality of second vias 17 are located without overlapping the electronic component 2 in a perspective plan view as shown in the examples shown in FIGS. 11A to 13B, like the electronic component mounting substrate 1, heat transfer from the electronic component 2 to the first vias 16 and the second vias 17 may be suppressed, and deterioration of the heat generation of the first vias 16 and heat generation of the second vias 17 may be suppressed, thus resulting in reduced occurrence of distortion in the insulating substrate 11.

The electronic component mounting substrate 1 according to the fourth embodiment may be manufactured using the same manufacturing method as the electronic component mounting substrate 1 according to the embodiment described above.

The present disclosure is not limited to the example of the embodiments described above, and various modifications are possible. For example, the insulating substrate 11 may have a rectangular shape having the notch 11b or a chamfered portion in a side surface or a corner thereof in a plan view.

In the electronic component mounting substrate 1 according to the first to fourth embodiments, although the side wall surface of the recess 12 is perpendicular to the bottom surface of the recess 12 in a longitudinal sectional view, the side wall surface of the recess 12 may be an inclined surface so that the opening of the recess 12 is wider than the bottom surface of the recess 12. Further, a reflective layer may be located on the side wall surface of the recess 12. For example, if a light emitting element is used as the electronic component 2, it may be suitably used as the electronic component mounting substrate 1 for a light emitting device having good light emission luminance by positioning a reflective layer with good reflectivity on the side wall surface of the recess 12.

The electronic component mounting substrates 1 according to the first to fourth embodiments may be combined with each other. For example, in the electronic component mounting substrate 1 according to the first embodiment, the recess 12 may be circular in a plan view.

In the embodiments described above, the examples are shown in which the insulating substrate 11 is formed of the four insulating layers 11a, but the insulating substrate 11 may be formed of three, or five or more insulating layers 11a.

The electronic component mounting substrate 1 may be manufactured in the form of a multi-piece electronic component mounting substrate.

The invention claimed is:

1. An electronic component mounting substrate comprising:
an insulating substrate comprising a recess that opens in a main surface of the insulating substrate, the recess for mounting an electronic component; a metal layer located on a bottom surface of the recess; an external electrode located on another main surface of the insulating substrate, the other main surface opposite to the main surface; a connection wiring located between the metal layer and the external electrode in a thickness direction of the insulating substrate; a plurality of first vias that connects the metal layer and the connection wiring and at least a portion of the plurality of first vias are located along a side wall of the recess in a perspective plan view; and a plurality of second vias that connects the connection wiring and the external electrode and that is located in a strip shape in the perspective plan view, wherein a notch is disposed in a side surface of the insulating substrate, and the connection wiring comprises a protrusion protruding to the side surface in which the notch is located in the perspective plan view.

2. The electronic component mounting substrate according to claim 1,
wherein the plurality of first vias overlaps an outer edge of the connection wiring in the perspective plan view.

3. The electronic component mounting substrate according to claim wherein the plurality of first vias overlaps the protrusion in the perspective plan view.

4. An electronic device comprising:
the electronic component mounting substrate according to claim 1; and
the electronic component mounted in the recess.

5. An electronic module comprising:
a module substrate comprising a connection pad; and
the electronic device according to claim 4 in which the external electrode is connected to the connection pad through solder.

6. The electronic component mounting substrate according to claim 2,
wherein a notch is disposed in a side surface of the insulating substrate, and
the connection wiring comprises a protrusion protruding to the side surface in which the notch is located in the perspective plan view.

7. The electronic component mounting substrate according to claim 6,
wherein the plurality of first vias overlaps the protrusion in the perspective plan view.

* * * * *